United States Patent
Chen et al.

(10) Patent No.: US 9,497,049 B2
(45) Date of Patent: Nov. 15, 2016

(54) WIDEBAND TRANSMITTER WITH HIGH-FREQUENCY SIGNAL PEAKING

(71) Applicant: QUALCOMM Incorporated, San Diego, CA (US)

(72) Inventors: Zhiqin Chen, San Diego, CA (US); Kenneth Luis Arcudia, Cary, NC (US); Tao Jiang, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/477,143

(22) Filed: Sep. 4, 2014

(65) Prior Publication Data

US 2016/0072645 A1    Mar. 10, 2016

(51) Int. Cl.
*H04L 27/00* (2006.01)
*H04L 25/02* (2006.01)
*H04B 1/04* (2006.01)

(52) U.S. Cl.
CPC ............ *H04L 25/028* (2013.01); *H04B 1/04* (2013.01)

(58) Field of Classification Search
CPC .......... H04L 25/0282; H04L 25/0272; H04L 25/028; H03K 17/122; H03K 19/017527; H03K 3/356182; H03F 1/34; H03F 3/45475; H03F 2200/91; H03F 2203/45138; H03F 3/24; H03F 2203/45406; H03F 2203/45418
USPC ........... 375/244, 244.295; 327/108, 103, 52, 327/563, 115, 82; 326/115, 82; 330/285, 330/296, 102, 252, 261
See application file for complete search history.

(56) References Cited

U.S. PATENT DOCUMENTS

| | | | |
|---|---|---|---|
| 6,335,655 B1* | 1/2002 | Yamamoto | H03H 11/0422 327/103 |
| 6,704,818 B1 | 3/2004 | Martin et al. | |
| 6,812,733 B1* | 11/2004 | Plasterer | H03K 3/356104 326/115 |
| 7,683,720 B1* | 3/2010 | Yehui | H03F 3/45192 30/252 |
| 7,906,994 B2 | 3/2011 | Bell | |
| 8,054,108 B2 | 11/2011 | Chen | |
| 8,362,813 B2 | 1/2013 | Yeung et al. | |
| 8,624,641 B1 | 1/2014 | Faucher et al. | |
| 8,638,838 B1 | 1/2014 | Betts et al. | |
| 2007/0075776 A1* | 4/2007 | Garlapati | H03F 3/3061 330/259 |
| 2008/0034378 A1 | 2/2008 | Kumar et al. | |
| 2011/0175649 A1 | 7/2011 | Wadekar et al. | |
| 2012/0299616 A1 | 11/2012 | Liu et al. | |

OTHER PUBLICATIONS

International Search Report and Written Opinion—PCT/US2015/041170—ISA/EPO—Dec. 22, 2015.

* cited by examiner

*Primary Examiner* — Rahel Guarino
(74) *Attorney, Agent, or Firm* — Haynes and Boone, LLP

(57) ABSTRACT

A transmitter is provided that includes a voltage-mode driver and a current-mode driver. The current-mode driver includes a plurality of transconductors biased by high-pass filtered versions of a differential output voltage from the voltage-mode driver.

27 Claims, 6 Drawing Sheets

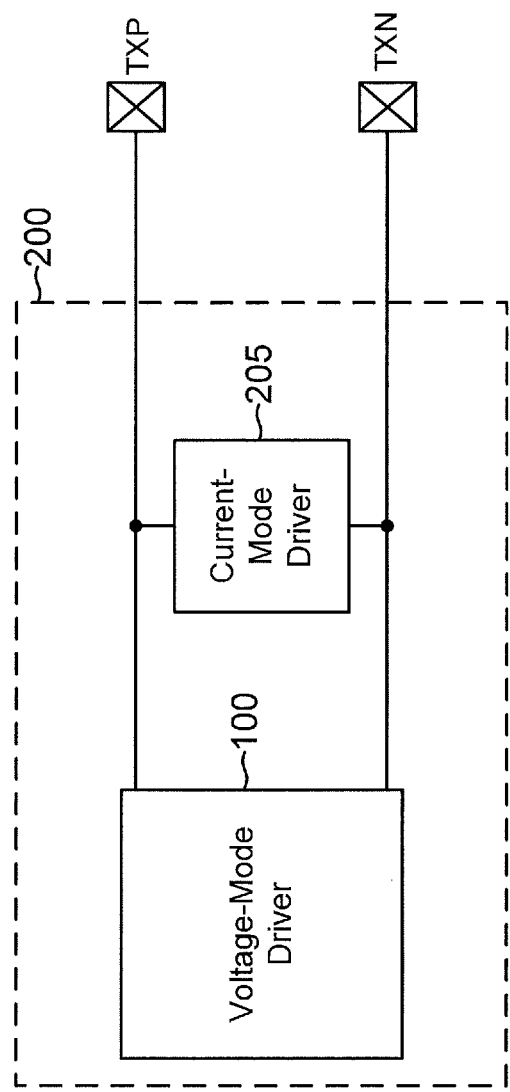

US 9,497,049 B2

WIDEBAND TRANSMITTER WITH HIGH-FREQUENCY SIGNAL PEAKING

TECHNICAL FIELD

This application relates to transmitters, and more particularly to a wide-band low-power transmitter with high-frequency signal peaking.

BACKGROUND

Modern microprocessors operate on relatively large words. For example, it is conventional for some microprocessors to process 64-bit words. As processor clock rates increase ever higher, the routing of such relatively wide-bit words on wide-bit buses becomes problematic. At high transmission speeds, the inevitable skew with regard to propagation on separate traces in the wide-bit buses may lead to unacceptable bit error rates. Moreover, such buses demand a lot of power and are expensive to design.

To enable the high-speed transmission of data words without the skew and distortion issues associated with high-speed wide-bit buses, serializer-deserializer (SERDES) systems have been developed. A SERDES transmitter serializes the data words into a high-speed serial data stream. A corresponding SERDES receiver receives the high-speed serial data stream and deserializes it back into the parallel data words. The serial transmission is usually differential and includes an embedded clock. The skew and distortion issues associated with high-speed wide-bit data buses are thus abated.

Although SERDES systems enable very high-speed data transmission such as 10 gigabits per second or even higher rates, the transmission characteristics for the differential serial data channel between the transmitter and receiver are not linear across the corresponding Nyquist channel bandwidth of 5 Ghz. Instead, the channel has a frequency-dependent response that reduces the amplitude of the higher-frequency portions of the data. To counter the resulting distortion, the SERDES transmitter includes an amplifier having a frequency response that is not linear across the channel bandwidth but instead emphasizes the higher frequency bands for the transmitted data spectrum. This emphasis can be problematic, however, in that it requires excessive amounts of power. But conventional attempts to reduce the transmitter power consumption limit the achievable bandwidth.

Accordingly, there is a need in the art for wideband and low-power transmitters that can compensate for channel frequency-dependent losses.

SUMMARY

A transmitter is provided that includes a voltage-mode driver for driving a differential output voltage across a pair of output nodes. A current-mode driver responds to the differential output voltage by steering a differential current through the output nodes. In response to the differential output voltage cycling into to a first polarity (either positive or negative), the current-mode driver drives the differential current through the output nodes in a first direction to increase the differential output voltage above that which could be produced by the voltage-mode driver alone. Similarly, as the differential output voltage swings to an opposite second polarity, the current-mode driver drives the differential current through the output nodes in a second direction to again increase the differential output voltage.

The current-mode driver includes a plurality of transconductors to generate the differential current that is used to increase the differential output voltage. Each transconductor responds to a bias voltage generated by one or more high-pass filters. The high-pass filters filter the differential output voltage to produce the bias voltages for the transconductors. Each bias voltage has a default level during low-frequency changes of the differential output voltage. The transconductors thus drive the differential current at a corresponding default level during these low frequency changes in the differential output voltage. Because of the high-pass filtering of the differential output voltage, the bias voltages are adjusted so that the differential current increases during high-frequency changes in the differential output voltage.

The resulting transmitter is quite advantageous in that driving the differential current through the output nodes consumes power. But the power consumption is minimized in that the differential current is boosted only at the high frequencies to compensate for the channel losses. These and other advantageous features may be better appreciated through the following detailed description.

BRIEF DESCRIPTION OF THE DRAWINGS

FIG. 2A is a block diagram of a transmitter including the voltage-mode driver of FIG. 1.

DETAILED DESCRIPTION

Figure 1:
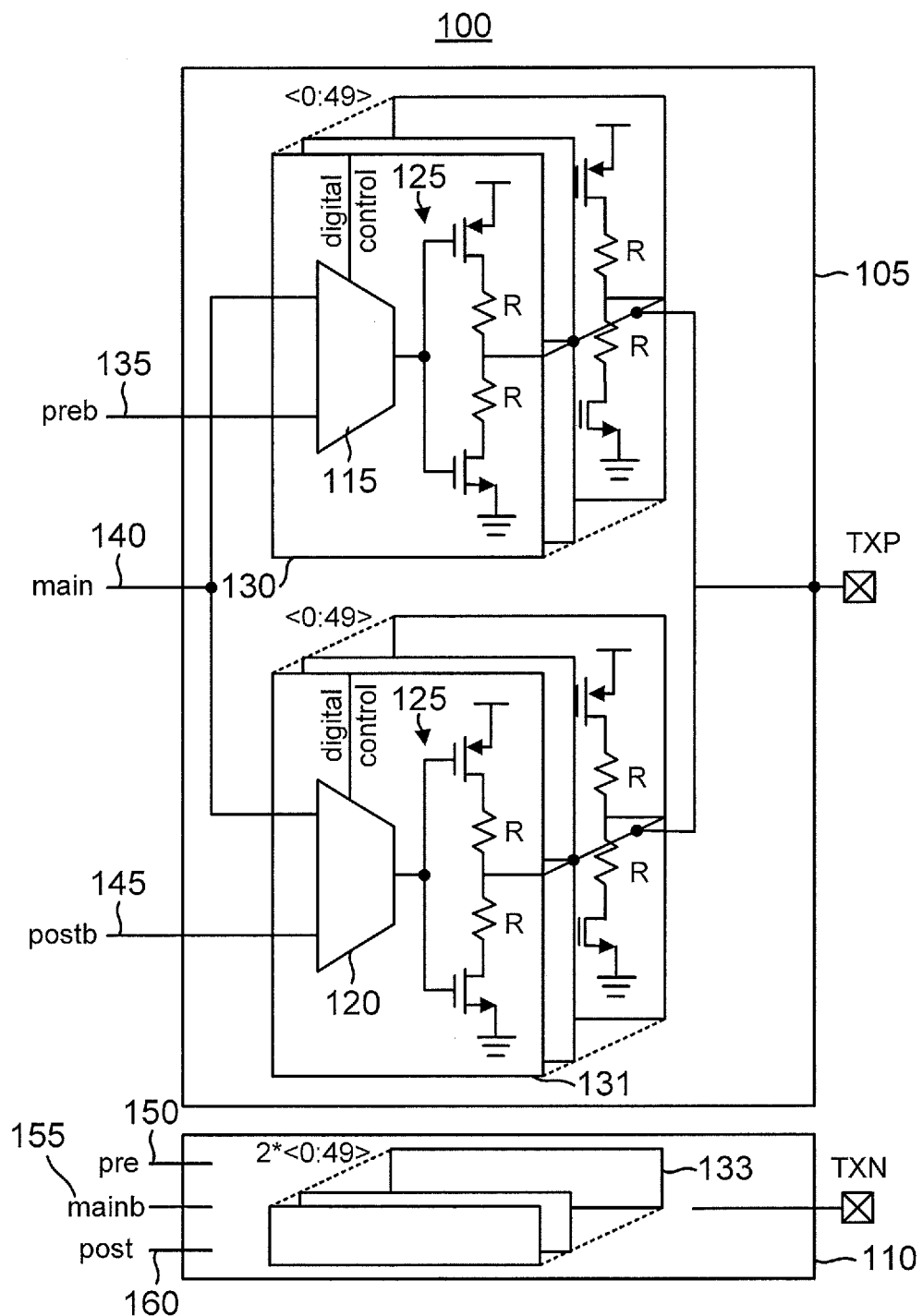
FIG. 1 is a schematic diagram of a voltage-mode driver in accordance with an embodiment of the disclosure.

A transmitter is provided that includes a differential voltage-mode driver that drives a true and complement output node pair that couples through a channel to a load such as a receiver. The channel and receiver driven by the voltage-mode driver form a load impedance between the output nodes. The voltage-mode driver itself has an output impedance such that the load impedance in combination with voltage-mode driver's output impedance effectively forms a voltage divider. For example, suppose that the load impedance and the voltage-mode driver output impedance are both 100Ω and that the power supply voltage for the voltage-mode driver equals VDD. In such a case, the differential voltage across the load impedance will range from VDD/2 to −VDD/2 such that the total differential voltage swing across the output nodes equals the power supply voltage VDD. Although voltage-mode drivers have excellent static power consumption, the limit on the output voltage swing becomes problematic as the power supply voltage VDD continues to decrease in the modern process nodes. In particular, various signaling protocols requires a certain amount of voltage swing that may not be satisfied by voltage-mode drivers alone at lower levels for the power supply voltage VDD.

To provide additional output voltage swing, a differential current-mode driver also drives the pair of output nodes responsive to the differential output voltage across the output nodes. As the differential output voltage (defined as the difference between the voltage of the positive output node and the voltage of the negative output node) goes positive, the current-mode driver injects current into the positive output node and receives current from the complement output node. Similarly, as the differential output voltage goes negative, the current-mode driver injects current into the negative output node and receives current from the positive output node. In this fashion, the differential output voltage swing is boosted by the differential current injected by the current-mode driver. Thus, even as the power supply voltage is reduced, the transmitter formed by the combination of the voltage-mode driver and the current-mode driver may satisfy a desired output voltage swing.

The current-mode driver includes a plurality of transconductors to generate the differential current responsive to corresponding bias voltages generated by a high-pass filtering of the differential output voltage. High-frequency changes in the differential output voltage thus cause an increase in the differential current injected through the output nodes by the current-mode driver. This is quite advantageous in that the resulting transmitter saves power because the differential current is not increased in the lower-frequency bands for the differential output voltage but instead is boosted only in the high-frequency bands to counter the high-frequency attenuation of the channel. These advantageous features may be better appreciated with regard to the following example embodiments.

The differential current injected by the current-mode driver thus drives the differential output voltage across the output nodes higher than what would otherwise exist from the voltage-mode driver alone. Note that the differential current injected through the output nodes by the current-mode driver is ultimately discharged into ground. To minimize the power loss that would otherwise exist from this discharging of the differential current, the differential current is only boosted during high-frequency changes in the differential output voltage due to the high-pass filtering of the differential output voltage to create the bias voltages that bias the transconductors within the current-mode driver. For example, the current-mode driver may include a pair of cross-coupled high-pass filters to provide the bias voltages for this boosting of the differential current responsive to high-frequency differential voltages across the output nodes.

Turning now to the drawings, an example differential voltage-mode driver 100 is shown in FIG. 1. A conventional pre-emphasis signal generator (not illustrated) generates a positive precursor (pre) input signal 150, a complement precursor (preb) input signal 135, a positive cursor (main) input signal 140, a complement main (mainb) input signal 155, a positive postcursor (post) input signal 160, and a complement postcursor (postb) input signal 145. Voltage-mode driver 100 includes a positive driver 105 that drives a true or positive output node TXP responsive to cursor input signal 140 and the complement precursor and postcursor signals 135 and 145. Similarly, voltage-mode driver 100 includes a complement driver 110 that drives a complement output node TXN responsive to complement cursor input signal 155 and true precursor and postcursor input signals 150 and 160.

Positive driver 105 includes a plurality of selectable circuits denoted as slices 130. Each slice 130 includes an inverting output circuit 125 that drives the TXP output node through corresponding resistors R. Each slice 130 also includes a multiplexer 115 that selects between cursor input signal 140 and complement precursor signal 135. Positive driver 105 also includes a plurality of selectable slices 131. Like selectable slices 130, each slice 131 includes an inverting output circuit 125. A multiplexer 120 in each slice 131 selects between cursor input signal 140 and complement postcursor input signal 145. Each slice 130 and 131 is selected to be active or dormant depending upon the desired output impedance that will be achieved through the resistance of the resistors R in the active slices' inverting output circuits 125. Slices 130 and 131 all couple in parallel to the TXP output node. Thus, the greater the number of active slices, the lower the output impedance. In this fashion, voltage-mode driver 100 may be configured to drive TXP output node with a calibrated output impedance that is determined by the number of active slices 130 and 131. Depending upon the selection at multiplexers 115 and 120, one of input signals 135, 140, and 145 is selected in to be inverted through inverting output circuits 125 to drive output node TXP. The total number of slices 130 and 131 within positive driver 105 depends upon the desired resistance adjustment range. In the illustrated embodiment, there is an array of fifty slices 130 and an array of fifty slices 131 although it will be appreciated that a greater or smaller number of such slices may be included in alternative embodiments. Depending upon the process corner used to manufacture voltage-mode driver 100, the number of active slices 130 and 131 may be selected to calibrate the output impedance accordingly.

Complement driver 110 also includes a plurality of slices 133 arranged into two arrays analogous to the array of slices 130 and the array of slices 131 in positive driver 105. These two arrays within complement driver 110 are not shown for illustration clarity but drive the complement output node TXN analogously to how slices 130 and 131 drive positive output node TXP. Each slice 133 within complement driver 110 would thus include its own multiplexer and inverting output circuit as discussed with regard to slices 130 and 131. Each multiplexer in the first array of slices 133 selects between complement cursor input signal 155 and true precursor input signal 150. Similarly, each multiplexer in the remaining second array of slices 133 selects between complement cursor input signal 155 and true postcursor input signal 160. The number of active slices in both true driver 105 and complement driver 110 is coordinated so that the same number of active slices in both drivers 105 and 110 is maintained to provide the desired output impedance.

Figure 2B:
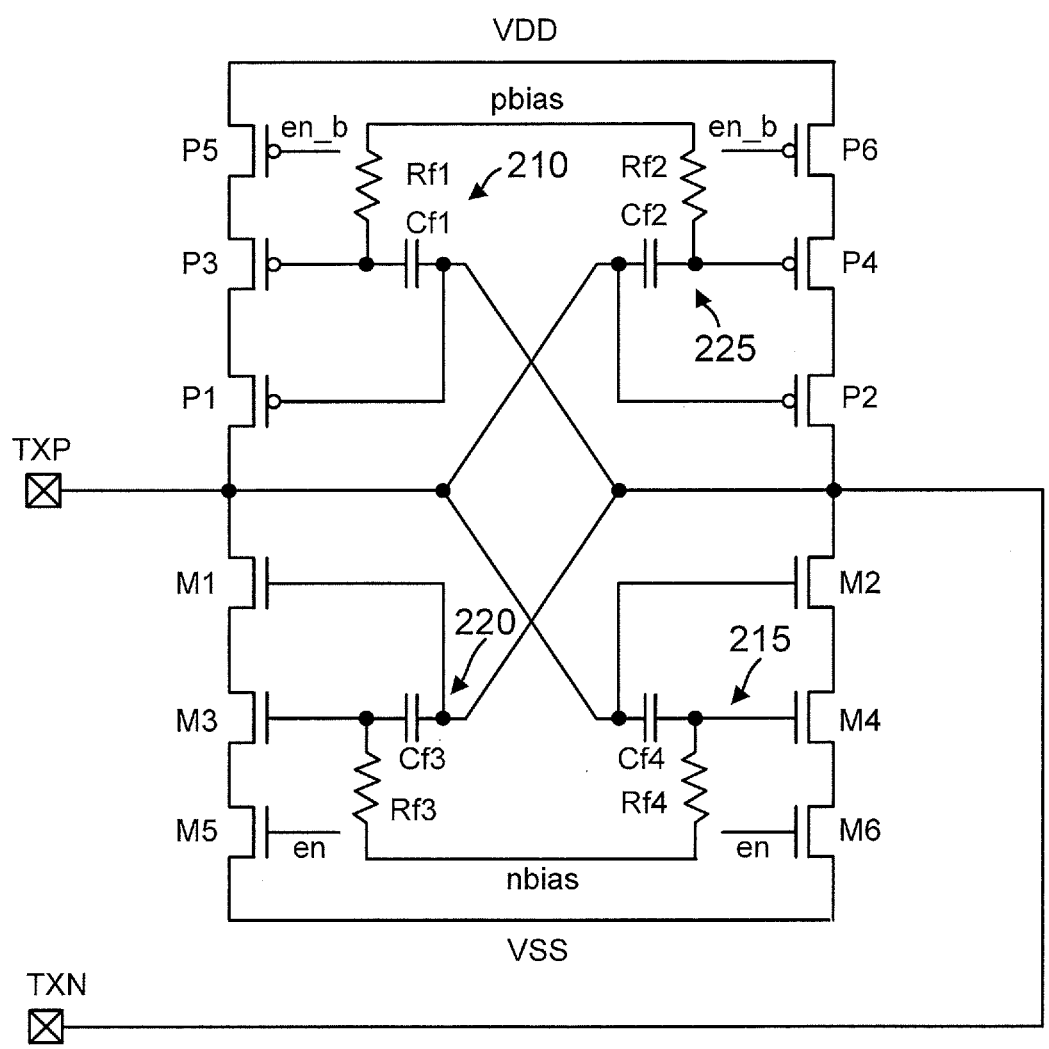
FIG. 2B is a circuit diagram of the current-mode driver in the transmitter of FIG. 2A in accordance with an embodiment of the disclosure.

To provide additional output voltage swing across the output signal bandwidth that is boosted even further at the higher frequencies, a transmitter 200 is provided that couples a differential current-mode driver 205 to differential voltage-mode driver 100 as shown in FIG. 2A. Current-mode driver 205 is shown in more detail in FIG. 2B. PMOS transistors P1 and P2 as well as NMOS transistors M1 and M2 act as switches to control the differential current drive through output nodes TXP and TXN. The voltage on the positive input node TXP drives the gates of switch transistors P2 and M2. Similarly, the voltage on the negative input node TXN drives the gates of switch transistors P1 and M1. Each switch couples to a corresponding transconductor transistor. For example, the switch formed by transistor P1 couples to a drain for a PMOS transconductor transistor P3. The source for transconductor transistor P3 couples through an enabling PMOS transistor P5 that acts as a switch to couple P3's source to a power supply node providing the power supply voltage VDD. Similarly, a source for switch transistor P2 couples to a drain of a PMOS transconductor transistor P4. The source for transconductor transistor P4 couples through an enabling PMOS transistor P6 to the power supply node.

The source for switch transistor M2 couples to a drain of an NMOS transconductor transistor M4 whose source couples to ground through an enabling NMOS transistor M6. Similarly, the source for switch transistor M1 couples to a drain for an NMOS transconductor transistor M3 whose source couples to ground through an enabling NMOS transistor M5. Each transconductor transistor is biased by a corresponding high-pass filter For example, a high-pass filter 210 biases the gate of transconductor transistor P3. Similarly, a high-pass filter 215 biases the gate of transconductor transistor M4. Finally, a high-pass filter 220 biases the gate of transconductor transistor M3 whereas a high-pass filter 225 biases the gate of transconductor transistor P4. Each high-pass filter 210, 215, 220, and 225 is designed to have a cutoff frequency that is determined by the particular application. For example, one application may need to boost the resulting differential output voltage at a cutoff frequency of approximately 5 GHz. In other applications, this cutoff frequency may be higher or lower depending upon the necessary signal bandwidth and channel characteristics.

Figure 3:
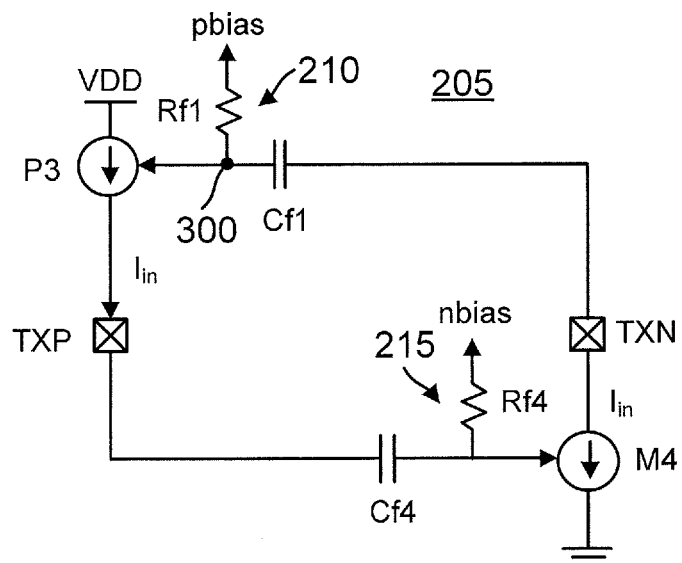
FIG. 3 is a simplified circuit diagram of the current-mode driver of FIG. 2B during a positive swing of the differential output voltage.

Due to the complementary action of switch transistors P1, P2, M1, and M2, current-mode driver 205 may be shown in a simplified form depending upon whether the differential output voltage between positive output node TXP and negative output node TXN is sufficiently positive or negative. For example, FIG. 3 is a simplified version of current-mode driver 205 when the differential voltage is sufficiently positive so as to switch on switch transistors P1 and M2 and to switch off switch transistors P2 and M1. There is thus no need to illustrate switch transistors M1 and P2 and their corresponding high-pass filters and transconductor transistors in FIG. 3 as these components have no electrical effect on the differential output voltage when the differential output voltage polarity has turned positive. Enabling transistors P5, P6, M5, and M6 act as conductors when on and thus these transistors are also not shown in FIG. 3. Referring again to FIG. 2B, high-pass filter 210 includes a capacitor Cf1 coupled between the negative output node TXN and a gate of transconductor transistor P3. High-pass filter 210 also includes a resistor Rf1 that couples between the gate of transconductor transistor P3 and a bias voltage node charged to a bias voltage pbias. Transistor P3 is shown more generically as a current source P3 in FIG. 3 that transconducts in response to the output voltage from high-pass filter 210. During low-frequency changes in the differential voltage between positive output node TXP and negative output node TXN, the voltage for an output node 300 for high-pass filter 210 equals the bias voltage pbias.

During such low frequency periods, current source P3 transconducts responsive to the default bias voltage pbias to drive a current into positive output node TXP when switch transistor P1 is conducting. However, when the differential output voltage changes to a positive polarity at a sufficiently high frequency, high-pass filter 210 passes the resulting high-frequency voltage decrease for the negative output node TXN to cause corresponding voltage changes at its high-pass filter output node 300. Note that when the differential output voltage swings negative even at high frequencies, there is no substantive effect at current source P3 since switch transistor P1 of FIG. 2B is switched off at those times. During a high-frequency positive swing of the differential output voltage, the voltage of output node 300 is pulled below the bias voltage pbias to more strongly source current into positive output node TXP to provide the high-frequency differential current boost through the output nodes. The voltage of output node 300 may thus be denoted as "High-filter-enhanced (HF-enhanced) pbias" in that its default value is approximately pbias but will be enhanced (in this case, decreased) so as to increase the corresponding differential current injected through the positive and negative output nodes TXP and TXN during high-frequency changes in the differential output voltage.

Referring again to FIG. 2B, the high-frequency positive swing of the differential output voltage also switches on switch transistor M2. The gate of corresponding transconductor transistor M4 is biased by a high-pass filter 215 that includes a resistor Rf4 coupled between a bias power supply node supplying a bias voltage nbias. Thus, during low-frequency positive swings for the differential output voltage, the gate of transconductor transistor M4 is biased by the bias voltage nbias. A capacitor Cf4 couples between the gate of transconductor transistor M4 and the positive input node TXP. In this fashion, high-pass filter 215 increases the gate voltage for the transconductor transistor M4 above the bias voltage nbias during a high-frequency positive swing of the differential output voltage. More current will then sink from negative input node TXN into ground as a result. The bias voltage for transconductor transistor M4 may thus be designated as "HF-enhanced nbias" in that the default value of nbias is enhanced (in this case, increased) to increase differential current injection during high-frequency changes in the differential output voltage.

Figure 4:
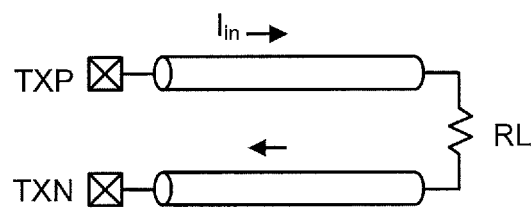
FIG. 4 illustrates the resulting differential current direction for the current-mode driver of FIG. 3.

Referring again to FIG. 3, transconductor transistor M4 of FIG. 2B is shown as a current source M4 that is biased by high-pass filter 215. The resulting differential current flow through the positive and negative output nodes TXP and TXN when the differential output voltage is positive is shown in FIG. 4. The differential current $I_{in}$ from current source P3 is driven out positive output node TXP and through a load impedance RL such as the load impedance presented by a receiver. The differential input current $I_{in}$ returns into negative output node TXN. Current source M4 then discharges current $I_{in}$ to ground as shown in FIG. 3.

Figure 5:
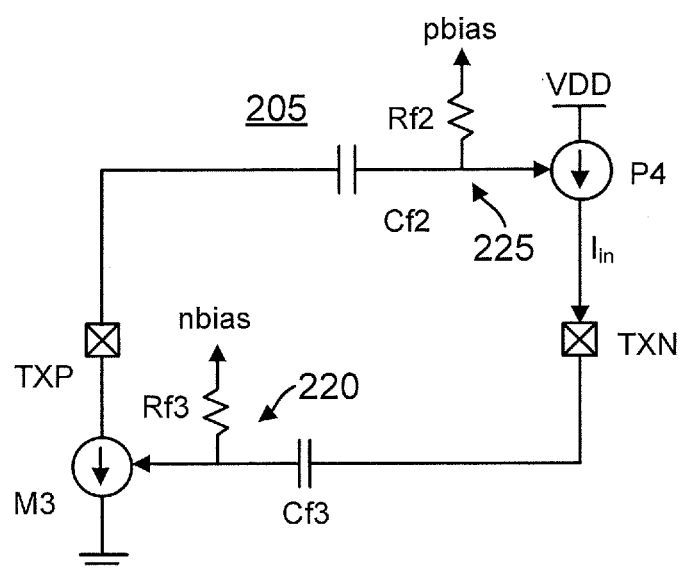
FIG. 5 is a simplified circuit diagram of the current-mode driver of FIG. 2B during a negative swing of the differential output voltage.

The converse situation when the differential output voltage swings sufficiently negative for current-mode driver 205 is shown in simplified form in FIG. 5. High-pass filter 225 includes a capacitor Cf2 and a resistor Rf2. Similarly, high-pass filter 220 includes a capacitor Cf3 and a resistor Rf3. The negative polarity for the differential output voltage switches on switch transistors P2 and M1 and switches off switch transistors P1 and M2. Switch transistors P1 and M2 and their corresponding transconductor transistors and high-pass filters thus have no electrical function at such times so that these structures are not shown in FIG. 5 for illustration clarity. Similarly, switch transistors P2 and M1 are effectively just conductors at these times so they are also not illustrated in FIG. 5. Transconductor transistors P4 and M3 are shown generically in FIG. 5 as corresponding current sources P4 and M3. Should the negative swing for the differential output voltage be sufficiently low frequency, the HF-enhanced bias voltages for current sources P4 and M3 equals pbias and nbias, respectively. The resulting injection of the differential current is then at a default level corresponding to the pbias and nbias voltages. But when the differential output voltage swings negatively at a sufficiently high frequency, the HF-enhanced bias voltage for current sources P4 and M3 causes a desirable boost of the differential current over the default level. The resulting differential current flow is thus in the opposite direction discussed previously with regard to FIG. 4. Given the complementary action of the switch transistors, switch transistors P1 and M2 may be deemed to comprise a first pair of cross-coupled switches whereas switch transistors P2 and M1 may be deemed to comprise a second pair of cross-coupled switches.

In one embodiment, the collection of high-pass filters 210, 215, 220, and 225 comprise a means for adjusting the bias voltages to increase the differential output voltage responsive to high-frequency changes in the differential output voltage.

To provide an ability to adaptively adjust the amount of differential current injection and corresponding enhancement at the higher frequencies, each transconductor transistor and corresponding enabling transistor discussed with regard to FIG. 2B may be implemented as an array of transconductor transistors and corresponding enabling transistors. The transconductor transistors within each array are arranged in parallel. If the whole transconductor array is enabled through switching on of the corresponding array of enabling transistors, the current-mode driver then injects a maximum amount of differential current. Conversely, as more of the enabling transistors are switched off, the injected differential current is reduced accordingly. In this fashion, the amount of differential current may be adaptively adjusted depending upon process corner, voltage supply level, temperature, and/or other related variables.

Figure 6:
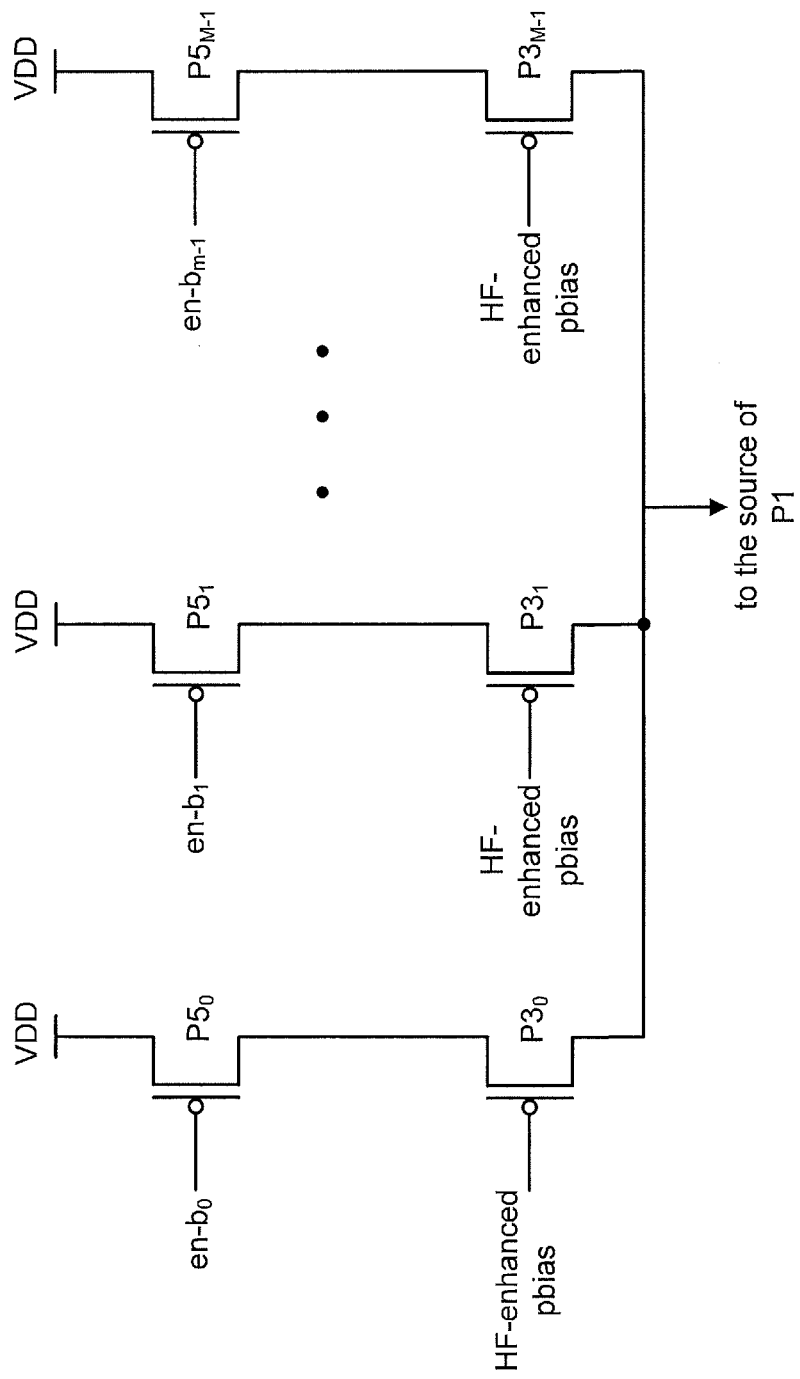
FIG. 6 illustrates an array of transconductor transistors and a corresponding array of enabling transistors for the current-mode driver of FIG. 2B.

For example, consider transconductor transistor P3 and corresponding enable transistor P5 discussed with regard to FIG. 2B. These transistors may be implemented as corresponding transistor arrays as shown in FIG. 6. In this embodiment, there are a total of M P3 transconductor transistors arranged in parallel from a zeroth transconductor transistor $P3_0$ to a (M−1)th transconductor transistor $P3_{M-1}$, where M is a integer greater than one. The gate for each transconductor transistor P3 is driven by the HF-enhanced pbias voltage as discussed with regard to FIG. 2B. The corresponding enable transistors $P5_0$ through $P5_{M-1}$ are controlled by an M-bit wide active low enable word (en_b) ranging from a zeroth enable bit en_b0 to an (M−1)th enable bit $en\_b_{M-1}$. The remaining transconductor transistors P4, M3, and M4 along with their enable transistors P6, M5, and M6 may be implemented using analogous arrays. However, the NMOS enable transistor arrays for M5 and M6 would be driven by active high enable bits (en) rather than the active low enable bits (en_b) that drive the PMOS enable transistor arrays.

Figure 7:
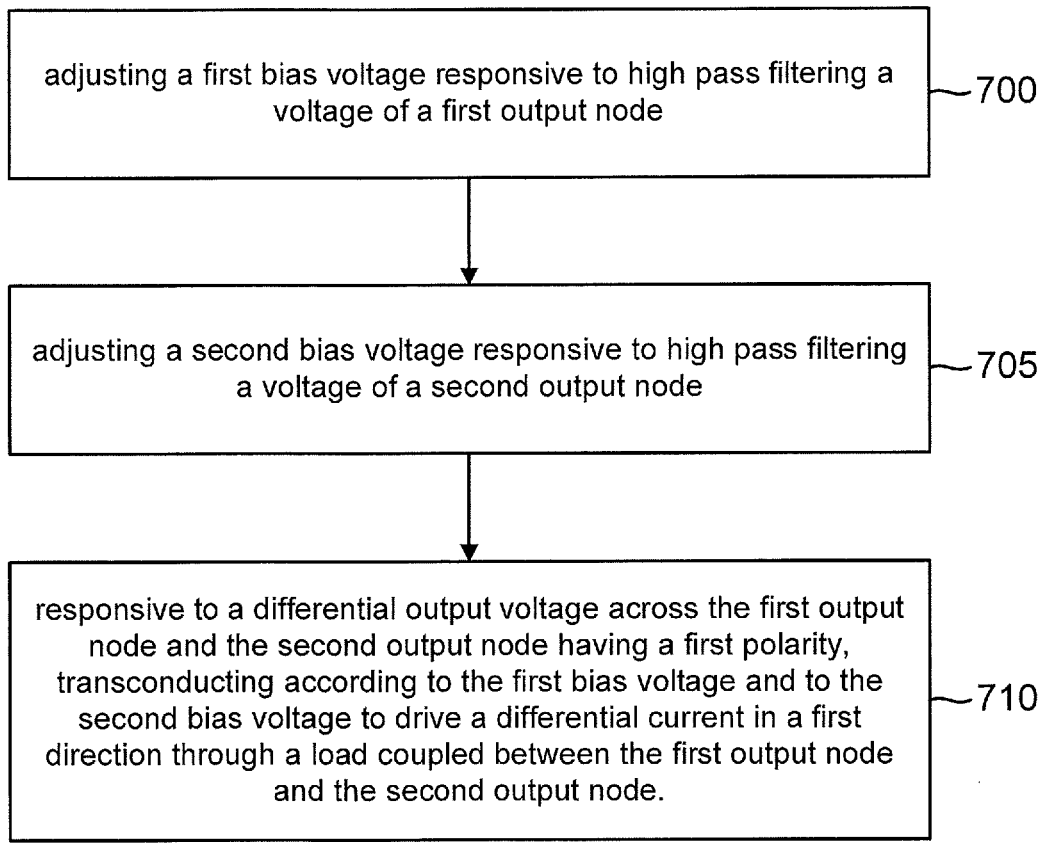
FIG. 7 is a flowchart for a method of operation for the transmitter of FIG. 2A.

A method of operation for transmitter 200 will now be discussed. As illustrated in the flowchart of FIG. 7, the method begins with an act 700 of adjusting a first bias voltage responsive to high-pass filtering a voltage of a first output node. Referring again to FIGS. 2B and 3, the adjusting of the "HF-enhanced pbias" voltage that drives the gate of transconductor transistor P3 in response to high-pass filtering the voltage of the negative output node TXN is an example of act 700. The method also includes an act of adjusting a second bias voltage responsive to high-pass filtering a voltage of a second output node. The adjusting of the "HF-enhanced nbias" voltage that drives the gate of transconductor transistor M4 in response to high-pass filtering the voltage of the positive output node TXP as discussed above is an example of act 705. Finally, the method includes an act 710 of transconducting according to the first bias voltage and the second bias voltage to drive a differential current in a first direction through a load coupled between the first output node and the second output node. Act 710 is responsive to a differential output voltage across the first output node and the second output node having a first polarity. The switching on of switch transistors P1 and M2 in response to the differential output voltage swinging positive so that transconductor transistors P3 and M2 can transconduct to drive the differential current through the load as shown in FIG. 4 is an example of act 710.

Those of ordinary skill will appreciate that numerous modifications may be made to the disclosed embodiments. For example, the disclosed high-pass filters are all shown as single order filter but could be constructed as higher order filters in alternative embodiments. Similarly, various electrostatic discharge protections circuits may be used as known in the electrostatic discharge protection arts to bolster the transmitter embodiments against electrostatic discharge damage. According, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A circuit, comprising:
a voltage-mode driver configured to drive a differential output voltage across a pair of output nodes;
a current-mode driver configured to drive a differential current through the pair of output nodes in a first direction responsive to a first polarity of the differential output voltage and in an opposite second direction responsive to an opposite second polarity of the differential output voltage, the current-mode driver including a plurality of transconductors for generating the differential current responsive to corresponding bias voltages; and
a plurality of high-pass filters corresponding to the plurality of transconductors, each high-pass filter configured to generate the bias voltage for the corresponding transconductor responsive to the differential output voltage.

2. The circuit of claim 1, wherein the current-mode driver includes a plurality of switches that are configured to switch responsive to the differential output voltage to control whether the differential current is driven in the first direction or in the opposite second direction.

3. The circuit of claim 2, wherein the plurality of switches comprises:
a first pair of cross-coupled switches; and
a second pair of cross-coupled switches.

4. The circuit of claim 1, wherein the voltage-mode driver comprises a positive driver for driving a positive one of the output nodes and a negative driver for driving a negative one of the output nodes.

5. The circuit of claim 4, wherein the positive driver includes a plurality of selectable slices to provide a calibrated output impedance at the positive output node depending upon how many selectable slices are selected.

6. The circuit of claim 4, wherein the negative driver includes a plurality of selectable slices to provide a calibrated output impedance at the negative output node depending upon how many selectable slices are selected.

7. The circuit of claim 1, wherein each high-pass filter comprise a serial combination of a capacitor and a resistor.

8. The circuit of claim 3, wherein the first pair of cross-coupled switches comprises a first PMOS transistor having a drain coupled to a positive one of the output nodes and having a gate coupled to a negative one of the output nodes and a first NMOS transistor having a drain coupled to the negative output node and a gate coupled to the positive output node.

9. The circuit of claim 8, wherein the second pair of cross-coupled switches comprises a second PMOS transistor having a drain coupled to the negative output node and having a gate coupled to the positive output node and a second NMOS transistor having a drain coupled to the positive output node and a gate coupled to the negative output node.

10. The circuit of claim 1, wherein each transconductor comprises an array of transconductors arranged in parallel.

11. The circuit of claim 10, further comprising a plurality of enabling transistor arrays corresponding to the plurality of transconductor arrays, and wherein each enabling transistor acts as a switch responsive to an enabling signal to control whether the corresponding transconductor contributes to the differential current.

12. The circuit of claim 1, wherein a first plurality of the transconductors comprise PMOS transistors and wherein a second plurality of the transconductors comprise NMOS transistors.

13. The circuit of claim 1, wherein the voltage-mode driver is configured to drive the differential output voltage responsive to a plurality of input signals from a pre-emphasis circuit.

14. A method, comprising:
adjusting a first bias voltage responsive to high-pass filtering a voltage of a first output node;
adjusting a second bias voltage responsive to high-pass filtering a voltage of a second output node; and
responsive to a differential output voltage across the first output node and the second output node having a first polarity, transconducting according to the first bias voltage and to the second bias voltage to drive a differential current in a first direction through a load coupled between the first output node and the second output node.

15. The method of claim 14, further comprising:
responsive to the differential output voltage having a second polarity that is opposite to the first polarity, transconducting according to the first bias voltage and the second bias voltage to drive the differential current in a second direction through the load, the second direction being opposite to the first direction.

16. The method of claim 15, further comprising turning off a first pair of switches and switching on a second pair of switches responsive to the differential output voltage having the first polarity.

17. The method of claim 16, further comprising switching on the first pair of switches and turning off the second pair of switches responsive to the differential output voltage having the second polarity.

18. A circuit, comprising;
a voltage-mode driver configured to drive a differential output voltage across a pair of output nodes;
a current-mode driver configured to drive a differential current through the pair of output nodes, wherein the current-mode driver includes a plurality of transconductors for generating the differential current responsive to corresponding bias voltages; and
means for adjusting the bias voltages to increase the differential output voltage responsive to high-frequency changes in the differential output voltage.

19. The circuit of claim 18, wherein the current-mode driver includes a plurality of switches that are configured to switch responsive to the differential output voltage to control whether the differential current is driven in a first direction or in an opposite second direction.

20. The circuit of claim 19, wherein the plurality of switches comprises:
a first pair of cross-coupled switches; and
a second pair of cross-coupled switches.

21. The circuit of claim 18, wherein the voltage-mode driver comprises a positive driver for driving a positive one of the output nodes and a negative driver for driving a negative one of the output nodes.

22. The circuit of claim 21, wherein the positive driver includes a plurality of selectable slices to provide a calibrated output impedance at the positive output node.

23. The circuit of claim 21, wherein the negative driver includes a plurality of selectable slices to provide a calibrated output impedance at the negative output node.

24. The circuit of claim 18, wherein the means comprises a plurality of high-pass filters.

25. The circuit of claim 20, wherein the first pair of cross-coupled switches comprises a first PMOS transistor having a drain coupled to a positive one of the output nodes and having a gate coupled to a negative one of the output nodes and a first NMOS transistor having a drain coupled to the negative output node and a gate coupled to the positive output node.

26. The circuit of claim 25, wherein the second pair of cross-coupled switches comprises a second PMOS transistor having a drain coupled to the negative output node and having a gate coupled to the positive output node and a second NMOS transistor having a drain coupled to the positive output node and a gate coupled to the negative output node.

27. The circuit of claim 18, wherein each transconductor comprises an array of transconductors arranged in parallel.

* * * * *